United States Patent
Chen et al.

(10) Patent No.: US 10,274,569 B2
(45) Date of Patent: Apr. 30, 2019

(54) MAGNETIC RESONANCE IMAGING SYSTEM WITH GHOST ARTIFACT REDUCTION AND METHOD OPERATION THEREOF

(71) Applicant: KONINKLIJKE PHILIPS N.V., Eindhoven (NL)

(72) Inventors: Zhaolin Chen, Eindhoven (NL); Silke Hey, Eindhoven (NL); Liesbeth Geerts-Ossevoort, Eindhoven (NL); Jos Jacques Koonen, Eindhoven (NL); Johan Samuel Van Den Brink, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 642 days.

(21) Appl. No.: 14/780,670

(22) PCT Filed: Mar. 20, 2014

(86) PCT No.: PCT/IB2014/059983
§ 371 (c)(1),
(2) Date: Sep. 28, 2015

(87) PCT Pub. No.: WO2014/155246
PCT Pub. Date: Oct. 2, 2014

(65) Prior Publication Data
US 2016/0041248 A1    Feb. 11, 2016

Related U.S. Application Data

(60) Provisional application No. 61/806,562, filed on Mar. 29, 2013.

(51) Int. Cl.
G01R 33/28 (2006.01)
G01R 33/48 (2006.01)
(Continued)

(52) U.S. Cl.
CPC ..... G01R 33/56554 (2013.01); G01R 33/283 (2013.01); G01R 33/5616 (2013.01); *G01R 33/4806* (2013.01)

(58) Field of Classification Search
CPC ............ G01R 33/56554; G01R 33/283; G01R 33/5616; G01R 33/4806
(Continued)

(56) References Cited

U.S. PATENT DOCUMENTS 5,672,969 A    9/1997 Zhou et al.
6,369,568 B1 *  4/2002 Ma ................... G01R 33/56554
                                                    324/307
(Continued)

FOREIGN PATENT DOCUMENTS

CN    101606841 A    12/2009
CN    102096054 A    6/2011
(Continued)

OTHER PUBLICATIONS

Bruder et al "Image Reconstruction for Echo Planar Imaging With Nonequidistant K-Space Sampling" Magnetic Reson. in Med. No. 2, vol. 23, p. 311-323 (Dec. 31, 1992).
(Continued)

*Primary Examiner* — Susan S Lee

(57) ABSTRACT

A magnetic resonance imaging (MRI) system (600) obtains magnetic resonance (MR) images of a volume. The MRI system includes at least one controller (610) configured to perform a preparation scan (103, 301) to acquire preparation echo phase information (105, PEPI) for a plurality of dynamics of a scan (300); output a plurality of pulse sequences (200), each pulse sequence is configured for a corresponding dynamic of the plurality of dynamics of the scan and includes a navigator sequence (204) and an image sequence (206); acquire navigation and image information (Continued)

(111, 117) for each corresponding pulse sequence of the plurality of pulse sequences; and/or form corrected image information (125) by correcting echo phase information in accordance with the preparation echo phase information, correcting at least one of gradient delay or frequency offset of the image information in accordance with the navigation information.

20 Claims, 7 Drawing Sheets

(51) Int. Cl.
    *G01R 33/561*      (2006.01)
    *G01R 33/565*      (2006.01)

(58) Field of Classification Search
    USPC .......................................................... 324/309
    See application file for complete search history.

(56) References Cited

U.S. PATENT DOCUMENTS

| | | | |
|---|---|---|---|
| 6,885,885 | B1 | 4/2005 | Takizawa et al. |
| 7,098,662 | B2 | 8/2006 | Hinks et al. |
| 7,492,155 | B2 | 2/2009 | He et al. |
| 8,229,542 | B2 | 7/2012 | Heid |
| 8,483,457 | B2 | 7/2013 | Hinks et al. |
| 8,934,694 | B2 | 1/2015 | Chen et al. |
| 2006/0066308 | A1 | 3/2006 | Hinks et al. |
| 2010/0237864 | A1 | 9/2010 | Stemmer |
| 2010/0237865 | A1 | 9/2010 | Stemmer |
| 2011/0291653 | A1* | 12/2011 | Umeda ............... G01R 33/5617 324/309 |
| 2012/0194187 | A1 | 8/2012 | Rehwald et al. |
| 2012/0249143 | A1* | 10/2012 | Umeda ............ G01R 33/56518 324/309 |

FOREIGN PATENT DOCUMENTS

| | | | |
|---|---|---|---|
| JP | 2012223469 | A * | 11/2012 |
| WO | 0184172 | A1 | 11/2001 |

OTHER PUBLICATIONS

Hu et al "Artifact Reduction in EPI With Phase Encoded Referene Scan" Magnetic Resonance in Medicine, vol. 36, No. 1 p. 166-171 (Dec. 31, 1996.
Schmithorst et al "Simultaneous Correction of Ghost and Geometric Distortion Artifacts in EPI Using a Multiecho Reference Scan" IEEE Trans. on Medical Imaging, vol. 20, No. 6, June 2001 p. 535-539.
Nie et al "Study on Processing Methods of Nyquist Artifacts in Magnetic Resonance Image of Brain Function" Chinese Journal of Medical Imaging, vol. 20 (8) 2004 p. 1277-1230.
Liu "A MRI Phase Artifacts Correction Method Based on Reference Scan" Journal of Data Acquisition and Processing, vol. 23,(3) 2007 p. 282-287.
Hinks et al "Image Reconstruction Using Dynamic EPI Phase Correction" Proc. Intl. Soc. Mag. Reson. Med. 14 (2006) p. 2348.
Barry et al, "Evaluation of Preprocessing Steps to Compensate for Magnetic Field Distortions Due to Body Movements in Bold FMRI" Magnetic Resonance Imaging 28 (2010) p. 235-244.
Buonocore et al, "Ghost Artifact Reduction for Echo Planar Imaging Using Image Phase Correction" Magnetic Resonance Med. 38, p. 89-100 (1997).
Kellman et al "Phased Array Ghost Elimination" NMR Biomed vol. 19, p. 352-362, 2006.
Zhang et al, "Refernce Scan Free Method for Automated Correction of Nyquist Ghost Artifacts in Echoplanar Brain Images" Magnetic Resonance in Med. 51 p. 621-624 (2004).
Xiang et al, "Correction for Geometric Distortion and N/2 Ghosting in EPI by Phase Labeling for Additional Coordinate Encoding" Magnetic Resonance in Medicine 57 p. 731-741 (2007).
Chen et al, "Two Dimensional Phase Cycled Reconstruction for Inherent Correction of Echo Planar Imaging Nyquist Artifacts" Magnetic Resonance in Med. 66 p. 1057-1066 (2011).
Foxall et al"Rapid Iterative Reconstruction for Echo Planar Imaging" Magnetic Resonance in Medicine 42, p. 541-547 (1999).
Clare et al Iterative Nyquist Ghost Correction for Single and Multi-Shot EPI Using an Entropy Measure, Proc. Intl Soc. Mag Res Med. p. 1041 2004.
Skare et al, A Fast and Robust Minimum Entropy Based Non-Interactive Nyquist Ghost Correction Algorithym, Proc. Intl. Soc. Mag. Reson. Med. 14 (2006) p. 2349.

* cited by examiner

MAGNETIC RESONANCE IMAGING SYSTEM WITH GHOST ARTIFACT REDUCTION AND METHOD OPERATION THEREOF

CROSS-REFERENCE TO PRIOR APPLICATIONS

This application is the U.S. National Phase application under 35 U.S.C. § 371 of International Application No. PCT/IB2014/059983, filed on Mar. 20, 2014, which claims the benefit of U.S. Patent Application No. 61/806562, filed on Mar. 29, 2013. These applications are hereby incorporated by reference herein.

This application claims the benefit of U.S. Provisional Patent Application No. 61/806562, filed Mar. 29, 2013. the entire contents of which are incorporated herein by reference.

Exemplary embodiments of the present system generally relate to a magnetic resonance imaging (MRI) system which acquires image information using nuclear magnetic resonance (NMR) methods and, more particularly, to a functional MRI (fMRI) system configured to reduce and/or stabilize ghost artifacts such as Nyquist ghost levels of image information obtained by dynamic fMRI scans and a method of operation thereof.

MRI images may suffer from ghost artifacts such as Nyquist ghost artifacts. To obtain images with low Nyquist ghost levels, it is important to control signal stability and timing. Unfortunately, many conventional MRI systems suffer from timing delays of hardware parameters, such as gradient timing, over the course of a scan such as those due to temperature changes. These timing delays adversely affect signal stability and, thus, increase ghost levels such as Nyquist ghost levels of images acquired during an MRI scan. Accordingly, signal processing methods are employed to reduce these Nyquist ghost levels. These signal processing methods typically comprise image-based post processing methods or sensitivity encoding methods.

With respect to the image-based post processing methods, early image-based post processing methods suffered from severe deficiencies with regard to the field of view (FOV) that needed to be acquired and/or required assumptions to be made with regard to an object to be scanned such as described in Buonocore et al., *Ghost Artifact Reduction for Echo Planar Imaging Using Image Phase Correction*, MRM 38:89-100, 1997; Foxall et al., *Rapid Iterative Reconstruction for Echo Planar Imaging*, MRM 42:54-547, 1999; Clare et al., *Iterative Nyquist Ghost Correction for Single and Multi-shot EPI using an Entropy Measure*, ProcISMRM p. 1041, 2003; and Zhang et al., *Reference-Scan-Free Method for Automated Correction of Nyquist Ghost Artifacts in Echoplanar Brain Images*, MRM 51:621-624, 2004, which are incorporated herein by reference as if set out in entirety herein. However, although many later image-based post processing methods such as described in Skare et al., *A Fast and Robust Minimum Entropy Based Non-Interactive Nyquist Ghost Correction Algorithm*, ProcISMRM p. 2349, 2006; and Chen et al., *Two-Dimensional Phase Cycled Reconstruction for Inherent Correction of Echo-Planar Imaging*, MRM 66:1057-1066, 2011, which are incorporated herein by reference as if set out in entirety herein, have overcome many of these deficiencies, their computational requirements limit their use in clinical practice.

With regard to conventional sensitivity encoding methods such as described in Kellman et al., *Phased Array Ghost Elimination*, NMR Biomed 19:352-362, 2006, which are incorporated herein by reference as if set out in entirety herein, although these methods may lower signal-to-noise ratios (SNR) due to g-factor constraints, they are typically not robust. Further sensitivity encoding techniques, such as a common phase labeling for additional coordinate encoding (PLACE) technique and the like such as described in Xiang et al., *Correction for Geometric Distortion and N/2 Ghosting in EPI by Phase Labeling for Additional Coordinate Encoding (PLACE)*, MRM 57:731-741, 2007, which is incorporated herein by reference as if set out in entirety herein, may inadvertently change fMRI contrast due to the combination of temporal information to signals which may change inherent signal characteristics.

The system(s), device(s), method(s), user interface(s), computer program(s), processes, etc. (hereinafter each of which will be referred to as system or the system, unless the context indicates otherwise), described herein address problems in prior art systems.

Embodiments of the present system provide for the real-time tracking and/or correction of signal delays such as gradient delays during fMRI scans. Accordingly, embodiments of the present system may stabilize and/or reduce Nyquist ghost levels of acquired MR images. Further, embodiments of the present system may be operative without substantially changing inherent signal characteristics of fMRI signals.

In accordance with embodiments of the present system, there is described a magnetic resonance imaging (MRI) system for obtaining magnetic resonance (MR) images of a volume, the MRI system including at least one controller configured to perform a preparation scan to acquire preparation echo phase information for a plurality of dynamics of a scan; output a plurality of pulse sequences each of which is configured for a corresponding dynamic of the plurality of dynamics of the scan and includes a navigator sequence and an image sequence; acquire navigation and image information for each corresponding pulse sequence of the plurality of pulse sequences; and form corrected image information by correcting echo phase information of the image information in accordance with the preparation echo phase information correcting at least one of gradient delay and frequency offset of the image information in accordance with the navigation information.

It is further envisioned that in each of the plurality of pulse sequences, the navigator sequence may immediately precede the image sequence. Moreover, the navigator sequence may further include a radio frequency (RF) signal (excitation) having a reduced flip angle waveform; and a slice select gradient signal having a weak slice selection waveform. Moreover, it is further envisioned that the controller may be configured to switch off phase encoding gradients when performing the navigator sequence. It is further envisioned that the image sequence may include a series of phase encoding gradient pulses. Moreover, the controller may be configured to reconstruct at least one image in accordance with the corrected image information. It is further envisioned that the MRI system may further include a display configured to render the reconstructed at least one image.

In accordance with yet other embodiments of the present system, there is described a method of generating magnetic resonance (MR) image information of a volume with a magnetic resonance imaging (MRI) system, the method performed by at least one controller of the MRI system and may include one or more acts of performing a preparation scan to acquire preparation echo phase information for a plurality of dynamics of a scan; generating a plurality of pulse sequences each of which is configured for a corresponding dynamic of the plurality of dynamics of the scan and includes a navigator sequence and an image sequence; acquiring navigation and image information for each corresponding pulse sequence of the plurality of pulse sequences; and forming corrected image information by correcting echo phase information of the image information in accordance with the preparation echo phase information correcting at least one of gradient delay and frequency offset of the image information in accordance with the navigation information.

The method may further include the act of generating the navigator sequence immediately preceding the image sequence in each of the plurality of pulse sequences. Further, the navigator sequence may include a radio frequency (RF) signal having a reduced flip angle waveform; and/or a slice select gradient signal having a weak slice selection waveform. It is further envisioned that the act of generating the navigator sequence may further included an act of switching off phase encoding gradients. Moreover, it is envisioned that the method may further include an act of generating the image sequence with at least a series of phase encoding gradient pulses. Moreover, the method may include an act of reconstructing at least one image in accordance with the corrected image information. It is further envisioned that the method may include an act of rendering the reconstructed at least one image on a display.

In accordance with yet another aspect of the present system, there is described a computer program stored on a computer readable memory medium, the computer program configured to generate magnetic resonance (MR) image information of a volume using a magnetic resonance imaging (MRI) system having main coils, gradient coils, and radio frequency (RF) transducers, the computer program including a program portion configured to perform a preparation scan to acquire preparation echo phase information for a plurality of dynamics of a scan; generate a plurality of pulse sequences each of which is configured for a corresponding dynamic of the plurality of dynamics of the scan and includes a navigator sequence and an image sequence; acquire navigation and image information for each corresponding pulse sequence of the plurality of pulse sequences; and form corrected image information by correcting echo phase information of the image information in accordance with the preparation echo phase information correcting at least one of gradient delay and frequency offset of the image information in accordance with the navigation information.

It is further envisioned that the program portion may be further configured to generate the navigator sequence immediately before the image sequence in each of the plurality of pulse sequences. Moreover, it is envisioned that the computer program may be configured to form the navigator sequence to include: a radio frequency (RF) signal having a reduced flip angle waveform; and a slice select gradient signal having a weak slice selection waveform.

Moreover, it is envisioned that when generating the navigator sequence, the computer program is may be configured to switch off phase encoding gradients. It is also envisioned that the computer program may be further configured to generate the image sequence with at least a series of phase encoding gradient pulses. In accordance with yet other embodiments, the computer program may be configured to reconstruct at least one image in accordance with the corrected image information and/or render the reconstructed at least one image on a display of the system.

The invention is explained in further detail, and by way of example, with reference to the accompanying drawings wherein.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well known devices, circuits, tools, techniques and methods are omitted so as not to obscure the description of the present system. It should be expressly understood that the drawings are included for illustrative purposes and do not represent the entire scope of the present system. In the accompanying drawings, like reference numbers in different drawings may designate similar elements.

Figure 1:
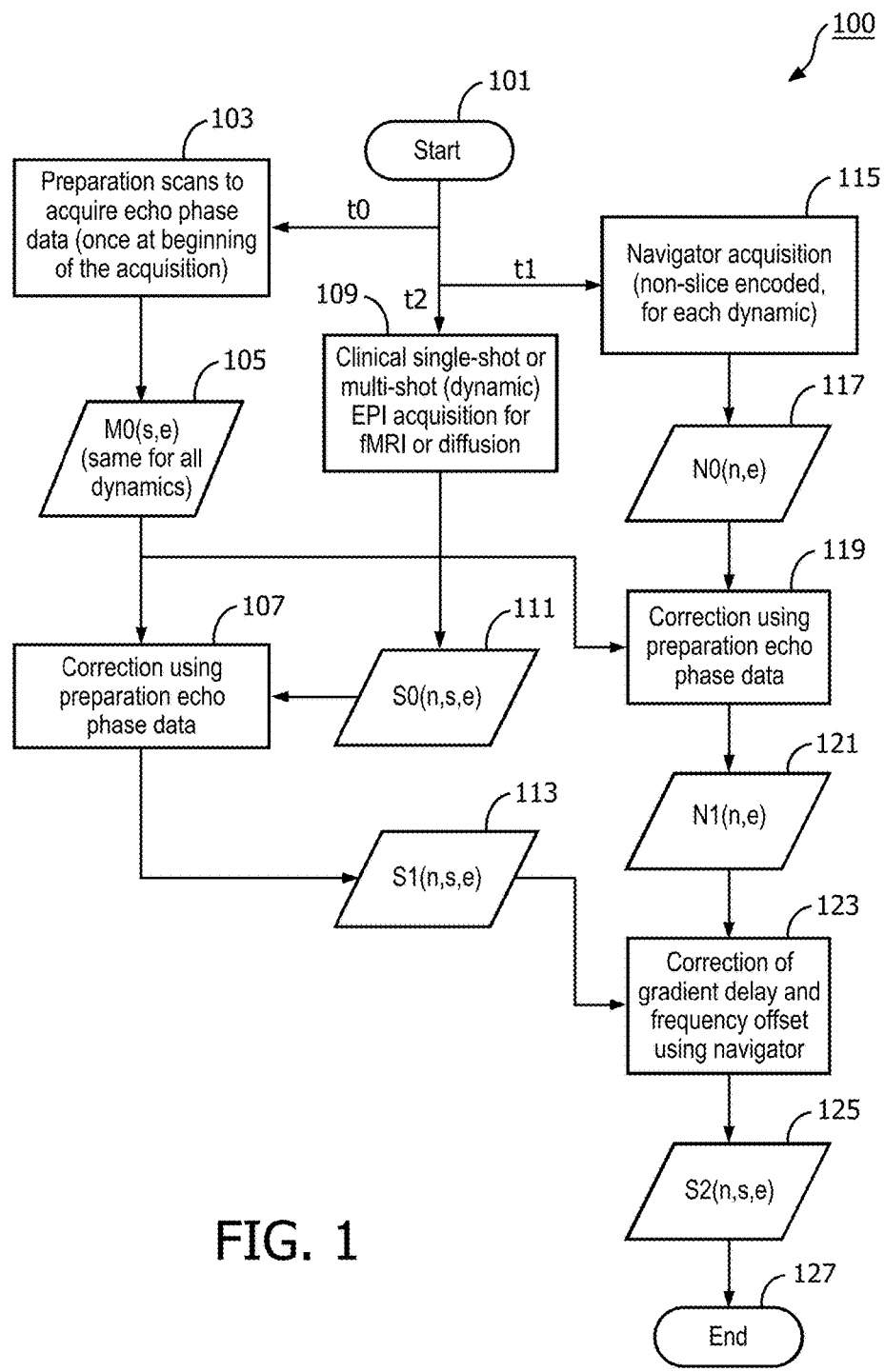
FIG. 1 is a flow diagram that illustrates a process performed by an MRI system in accordance with embodiments of the present system.

FIG. 1 is a flow diagram that illustrates an exemplary process 100 performed by an MRI system in accordance with embodiments of the present system. The process 100 may be performed using one or more computers communicating over a network and may obtain information and/or store information using one or more memories which may be local and/or remote from each other. The process 100 may include one of more of the following acts. Further, one or more of these acts may be combined and/or separated into sub-acts, if desired.

The scan time in accordance with embodiments of the present system may last for example for several minutes and may include a plurality of dynamic scans (which may be referred to as a dynamic or a scan dynamic). In operation, the process may start during act 101 and then proceed to act 103. In embodiments of the present system, each of the dynamic scans may have an index such as n, where n is equal to 0 through N scans. With regard to initial timing, the process may perform act 103 (e.g., only once) at $t_0$, act 115 at $t_1$, and act 109 at $t_2$. Thereafter, the process may repeat acts 115 and 109 (as well as the related dependent acts) for each scan dynamic (e.g., N times in the current example).

Each scan dynamic may include image information of a volume (e.g., a three-dimensional (3D) imaging volume). Further, one or more of the acts of process 100 may be performed sequentially or in parallel with one or more other acts of the process 100.

During act 103, the process may perform a preparation scan to acquire preparation echo phase information (data) of the volume (PEPI). In accordance with embodiments of the present system, this act may be performed once during the process 100. The preparation scan may include acts of generating and outputting a preparation scan sequence and acquiring corresponding echo information. For example, FIG. 2C is a graph 200C showing a portion of preparation scan sequence formed in accordance with embodiments of the present system. As shown, a phase preparation sequence 201 may be performed at the beginning of the scan followed by a first navigation sequence 204C (which is similar to the navigation sequence 204 of FIG. 2A) and an image sequence 206C (which is similar to the image sequence 206 of FIG. 2A). Thus, the graph 200C illustrates a first dynamic scan where an initial phase preparation process is illustratively performed only once and is used for each slice of a plurality of slices (e.g., each slice corresponding with a scan dynamic of a plurality of scan dynamics) of the scan, then a dynamic phase navigator and slice acquisition sequences are repeatedly performed for each slice (e.g., image) of the plurality of slices (e.g., images) of the scan.

Thereafter, the echo information may be processed by a controller of the system to form preparation echo phase information (PEPI) M0(s,e) during act 105, where s is a slice index and e is an echo index. The preparation echo phase information (PEPI) M0(s,e) may be the same for each dynamic of a plurality of dynamics of the scan. For example, in the current scan there is assumed to be N dynamics each of which may be identified using an index n, where n is an integer and $1<=n<=N$. M0(s,e) may be calculated from the non-phase encoded echo phase data, and it captures the zeroth and first order phase errors of the system at a beginning of the scan.

During act 115, the process may perform a navigator acquisition process to obtain raw navigator information for a current dynamic (e.g., dynamic index (n)). This raw navigation information may include phase delay information of the whole volume. The raw navigation information may then be processed and applied to each subsequent slice of the current dynamic (e.g., a slice having the same dynamic index (n) which, in the current example is considered to be the $n^{th}$ dynamic) in the dynamic scan as will be discussed below. The raw navigator information is calculated by comparing the phase differences amongst different readout lines, and the navigator captures the zeroth and first order phase delay errors for each dynamic of the whole 3D volume. During this acquisition process, a channel combination may be performed to minimize rigid head motion artifacts.

The navigator acquisition process may form and output a pulse sequence for a current dynamic (e.g., the $n^{th}$ dynamic) which includes at least a navigator sequence (e.g., including one or more navigator signals) which immediately precedes a slice selective sequence for the same dynamic. This is better illustrated with reference to FIG. 2A which shows a pulse sequence 200 formed in accordance with embodiments of the present system. The pulse sequence 200 may be generated for each corresponding dynamic (e.g., which will be identified using a dynamic index (n), where n is an integer and $1<=n<=N$). The pulse sequence 200 may include a navigator sequence 204 which immediately precedes an image sequence 206 for the current dynamic. The pulse sequence 200 may include a radio frequency (RF) signal such as $RF_{am}$ which may illustrate amplitude of the RF signal (e.g., shown in micro tesla), a slice select gradient signal (S or $G_{ss}$), a phase encoding gradient signal (P or $G_{pe}$), and a readout gradient signal ($G_M$ or M) 221.

Figure 2A:
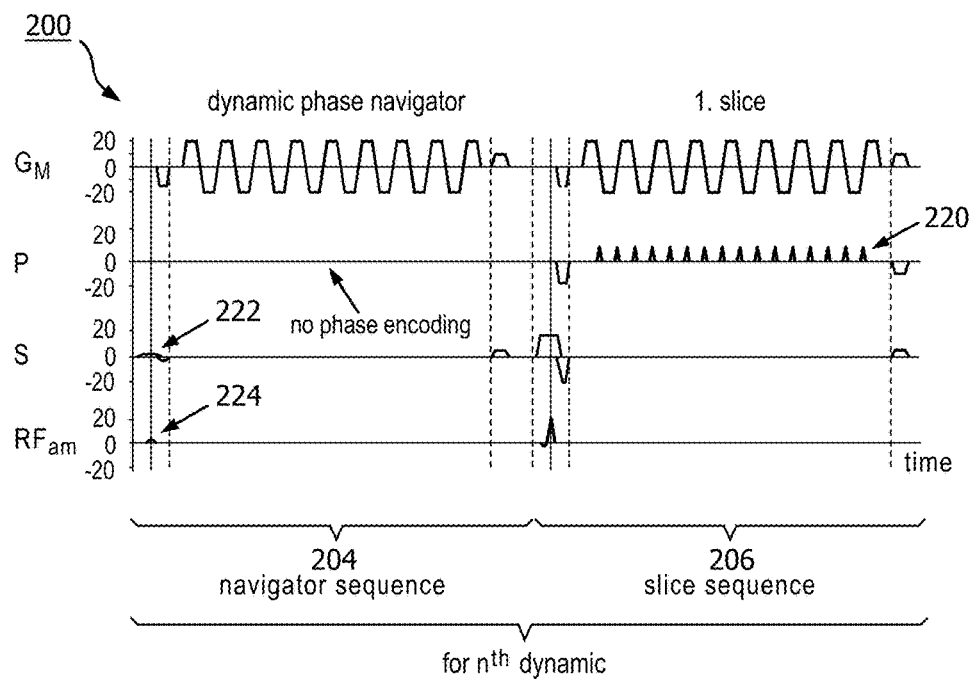
FIG. 2A is a pulse sequence formed in accordance with embodiments of the present system.

The navigator sequence 204 for the current dynamic of the pulse sequence may include a gradient signal (S) having a weak slice selection 222 and an RF signal $RF_{am}$ having a reduced flip angle 224 each of which is shown in FIG. 2A. The reduced flip angle 224 may have a values of about 10 degrees. However, in yet other embodiments other values are also envisioned. The slice selection gradient is chosen such that it selects a volume which fully contains all imaged slices. In accordance with embodiments of the present system, the flip angle is chosen in a way that the saturation of the longitudinal magnetization for the following slices is minimal while preserving maximal signal for the navigator sequence. After outputting at least a portion of the navigator sequence 204, the process may during act 117 receive corresponding echo information, and form corresponding navigator information N0(n,e), where n is the dynamic index (e.g., the current dynamic) and e is the echo index. Generally, the navigator information N0(n,e) may include information suitable to form a non-phase encoded, weakly slice encoded, navigator for each corresponding dynamic of the N dynamics of the scan. Thus, the process may perform a 2D excitation which, as a result of the weak slice encoding gradient, may excite a very thick 2D slab. Thus, the navigator sequence (204) may produce a 2D signal distribution of the excited slab.

In some embodiments, the navigator acquisition process may include one or more acts of switching off phase encoding gradients (e.g., P or $G_{pe}$) (220) and applying a weak slice selective excitation with a small flip angle optimized to minimize potential disturbance of the steady-state signal per slice, while maintaining sufficient signal. In accordance with embodiments of the present system, by exciting a slice location continuously over several dynamic scans with a constant flip angle and timing (repetition time), a steady state value of the longitudinal magnetization is achieved. Since the navigator sequence excites the same spatial locations with a different flip angle, the steady state behavior is disturbed since the longitudinal magnetization has less time to recuperate than without the navigator. This effect increases with increasing flip angle of the navigator. As a result, a compromise has been found between the signal of the navigator sequence which increases (e.g., up to a certain point) with flip angle and the disturbance of the magnetization of the following slices which also increases with the flip angle. After completing act 115, the process may continue to act 119.

During act 109, the process may perform an image acquisition process. This image acquisition process may include any suitable image acquisition process such as a clinical single-shot (e.g., single RF excitation pulse) or multi-shot (e.g., two or more RF excitation pulses) echo planar imaging (EPI) acquisition for fMRI or diffusion imaging for the current dynamic and obtain corresponding raw image information as discussed below herein. In accordance with embodiments of the present system, at $t_2$ following the dynamic phase navigator sequence 204, the process may output the image sequence 206 signal portion of the pulse sequence 200 for the current dynamic and acquire corresponding echo information. The process may thereafter receive corresponding raw image information S0(n,s,e) during act 111 (e.g., image information). The index n may correspond with the current index. After completing act 111, the process may continue to act 107.

During act 107, the process may correct the phase of the raw image information S0(n,s,e) in accordance with the preparation echo phase information M0(s,e) to correct echo phase of the raw image information S0(n,s,e). This operation corrects S0(n,s,e) for the zeroth and first order phase errors per slice which are calculated once at beginning of the scan during preparation phase, and forms corresponding echo phase corrected information S1(n,s,e) during act 113. M0(s,e) may be calculated by conjugated multiplication of ky=−1 with ky=+1 lines, and with the result then divided by ky=0 line. As mentioned with regard to acts 103, 105, the preparation echo phase information (PEPI) M0(s,e) may be the same for each dynamic for each dynamic (e.g., of the N dynamics) of the scan. In accordance with these embodiments of the present system, M0(s,e) does not need to have a dynamic index (n).

During act 119, the process may correct the phase of the raw navigator information N0(n,e) of act 117 for the current dynamic (e.g., the current index n) in accordance with the preparation echo phase information M0(s,e) of act 105 and form corresponding echo phase corrected navigator information N1(s,e) during act 121. The navigator information may be corrected using preparation phase data for the initial phase errors in each slice. After completing act 121, the process may continue to act 123.

In accordance with embodiments of the present system, the raw navigator information 117 N0(n,e) of act 117 for the current dynamic e.g., the current index n) may be evaluated against the raw navigator information 117 N0(0,e) of act 117 for the first dynamic (i.e. index 0) during act 119. The derived phase difference between N0(n,e) and N0(0,e) may then be used to correct the image information in act 123.

During act 123, the process may correct gradient delay and/or frequency offset of the echo phase corrected information S1(n,s,e) from act 113 in accordance with the echo phase corrected navigator information N1(n,e) and form corresponding navigator corrected information S2(n,s,e). The zeroth and first order phase errors and f0 offset are therefore compensated. This information may be referred to as content which may be stored in a memory of the system, processed further, and/or rendered on a user interface (UI) of the system such as a display for the convenience of the user (e.g., in real time).

The process may repeat acts 109 and 115, as well as acts which follow these acts in real time (e.g., acts 111, 107, and 113; and 117, 119, 121, 123, and 125, respectively), for each dynamic of the N dynamics of the scan. Further, the process may include a counter which may increment n before, or when a new dynamic is started. For example, each time a dynamic is completed, the counter may increment the current index n (e.g., n=n+1 up to n=N) before repeating acts 109 and 115 and the acts that follow in real time (e.g., acts 107, 111, 113, 117, 119, 121, 123, and 125). Further, the counter may initialize n=1 for the first dynamic.

Referring back to FIG. 2A, the dynamic pulse sequence 200 may be generated by a signal generator of the present system under the control of a controller of the system and output signals to their desired coils such as gradient coils (e.g., phase encoding gradient coils (Gpe), readout gradient coils (Gro), slice selection gradient coils (Gss), RF coils (e.g., the RF coils), main magnet coils, etc. One or more of the coils may be formed from superconducting or non-superconducting coils. Further, one or more of the coils such as the RF coils may form an array of coils. The pulse sequence 200 may include the navigator sequence 204 and an image sequence 206 each of which is formed in accordance with a corresponding dynamic index (n). With regard to sequence timing, the navigator sequence 204 (the navigator) may be output at time t1 and the image sequence (first slice) may be output at time t2. After completing the first dynamic of the pulse sequence, the pulse sequence 200 may be repeated for each of the dynamics (e.g., N in the current embodiments) of the scan.

Figure 2B:
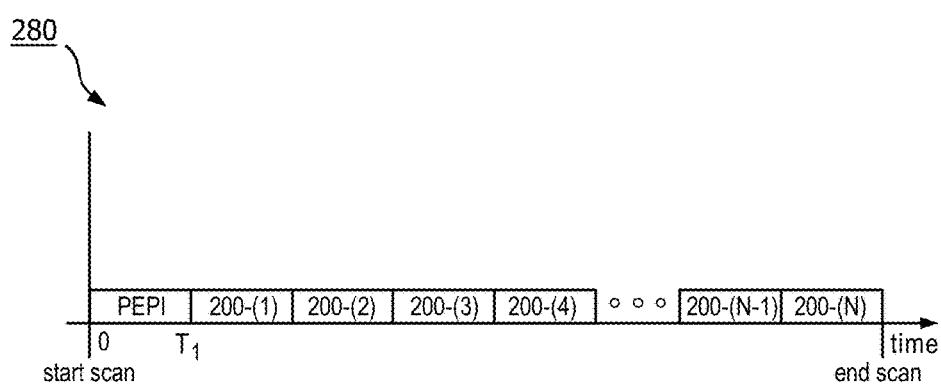
FIG. 2B is a graph of a dynamic acquisition order of a scan performed in accordance with embodiments of the present system.
Figure 2C:
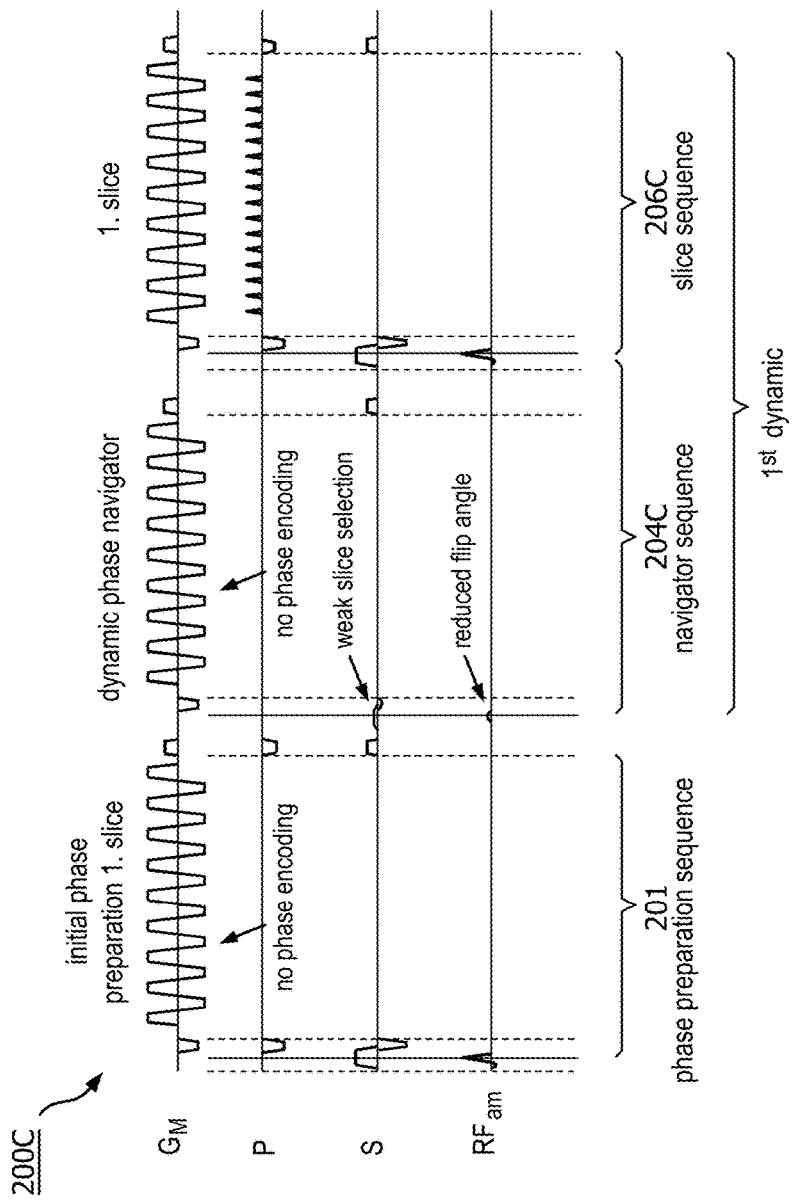
FIG. 2C is a graph of a preparation scan sequence formed in accordance with embodiments of the present system.

FIG. 2B shows a graph 280 of a dynamic acquisition order of a scan performed in accordance with embodiments of the present system. Preparation EPI (PEPI) information is acquired in accordance with embodiments of the present system at the start of the scan. Thereafter, first through Nth dynamic pulse sequences 200-(1) through 200-(N), respectively, are sequentially output and corresponding echo information including image information and navigator information obtained and processed in accordance with embodiments of the present system so as to form navigator corrected information (e.g., S2(n,s,e), content) which may be output via a user interface of the system (e.g., a display in real time, etc.), further processed, and/or stored in a memory of the system for later use.

Thus, in accordance with one or more embodiments, during each of the N pulse sequences (comprising the dynamics of the scan), a corresponding portion of k-space may be scanned and corresponding k-space information formed. At least a portion of the k-space information may be used to reconstruct one or more images. The index N may be adjusted so that a desired object may be scanned in the scanning volume.

Figure 3:
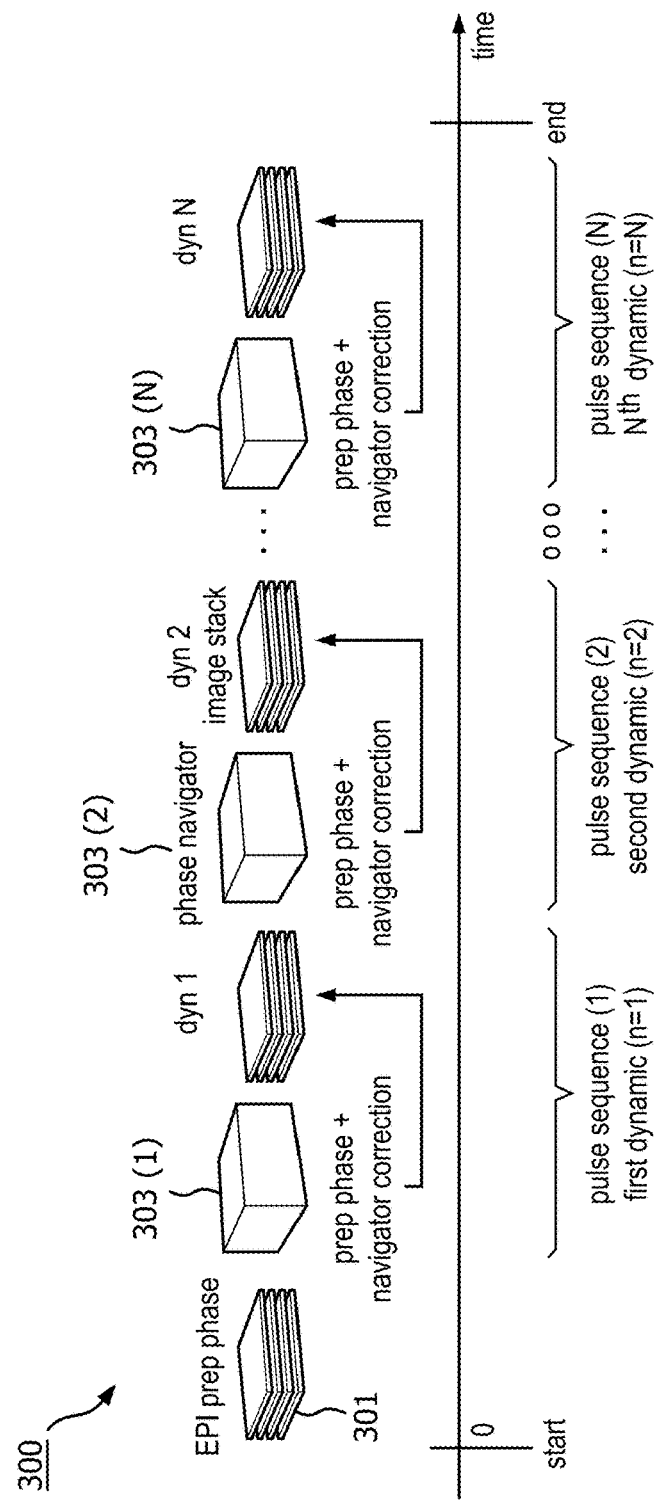
FIG. 3 is a graph of a dynamic acquisition order of a scan performed in accordance with embodiments of the present system.

FIG. 3 shows a graph 300 of a dynamic acquisition order of a scan 300 performed in accordance with embodiments of the present system. The scan may include first through $N^{th}$ dynamics. Preparation echo phase information (PEPI) (such as M0(s,e)) 301 may be acquired for example once during an EPI prep phase performed at the beginning of the scan 300. Thereafter, dynamic acquisitions 303(1) through 303(N) (generally 303(n)) of the scan 300 may be performed. During each of these dynamic acquisitions 303(n), the process may sequentially output first through $N^{th}$ (assuming a total of N dynamics) dynamic pulse sequences such as pulse sequence 200 (for each dynamic) and acquire corresponding navigator information and raw image information. Then, the raw image information may be processed in accordance with the navigator information and the preparation echo phase information to form navigator corrected information of an image stack as shown. The image stack represents the imaging volume consisting of s=0 . . . S slices.

Experimental Results

Results obtained from experiments performed in accordance with embodiments of the present system will now be shown with reference to FIGS. 4A through 5B. Exemplary images used herein were acquired on a Philips Achieva TX 3T MR system using a 32 channel head coil and the following sequence parameters: TR=2000 ms, TE=30 ms, FOV=240×240 mm$^2$, 3×3×3 mm$^3$.

Figures 4A, 4B:
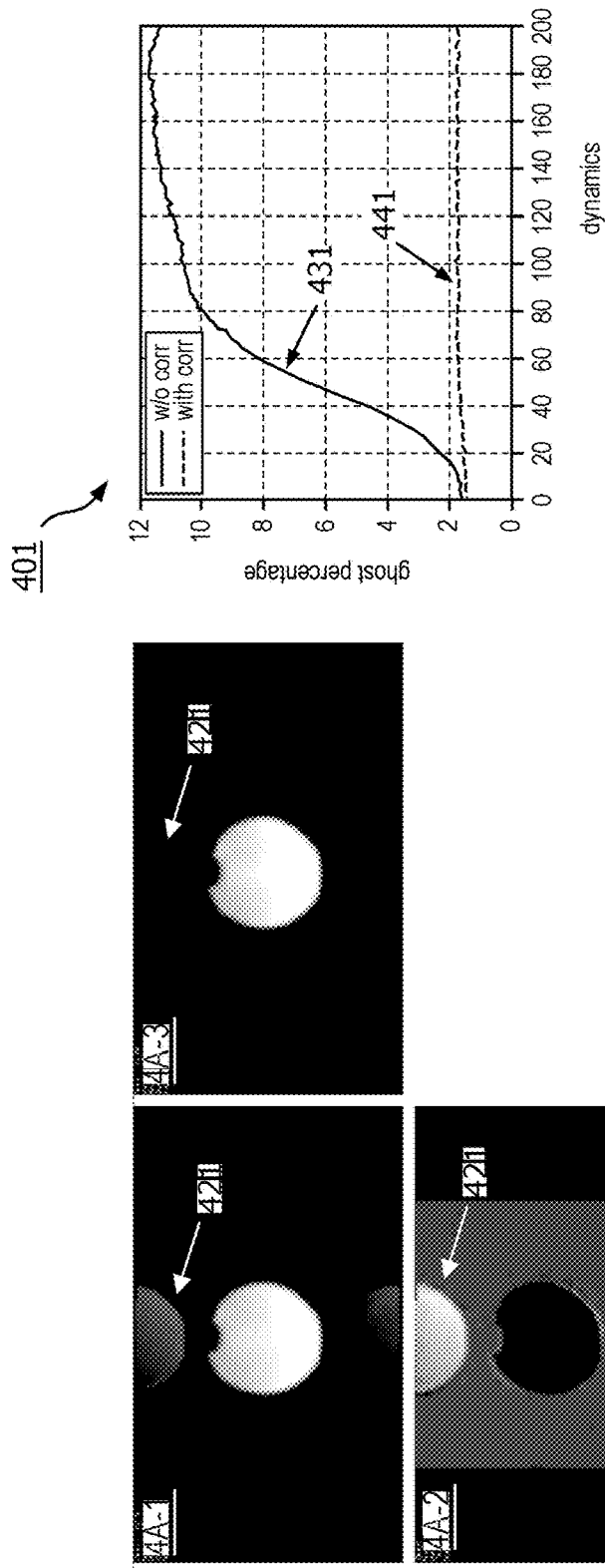
FIG. 4A is a screenshot of images obtained using phantom experiments performed in accordance with embodiments of the present system.
FIG. 4B is a graph showing comparison of results of phantom experiments from experiments performed in accordance with embodiments of the present system.

FIG. 4A shows a screenshot of images obtained using phantom experiments performed in accordance with embodiments of the present system. The images are labeled 4A-1, 4A-2, and 4A-3 and show acquisition with initial phase correction only, difference, and patch images, respectively. Arrows 421 illustrate a Nyquist ghost.

FIG. 4B is a graph 401 showing comparison of results of phantom experiments from experiments performed in accordance with embodiments of the present system. More, particularly, graph 401 illustrates percent ghosting (e.g., Nyquist ghosting) vs. scan dynamics for acquisition with initial phase correction only scans 431 (e.g., uncorrected scans) and patched scans 441 (e.g., corrected scans) which are navigator corrected in accordance with embodiments of the present system. Note how the percent ghosting increases as the scan dynamic increases for the acquisition with initial phase correction only scans 431. This illustrates scanning instability. However, the patched scans 441 (e.g., navigator corrected scans performed in accordance with embodiments of the present system) significantly reduce the percent ghosting and maintain stability of the patched scans 441.

Figures 5A, 5B:
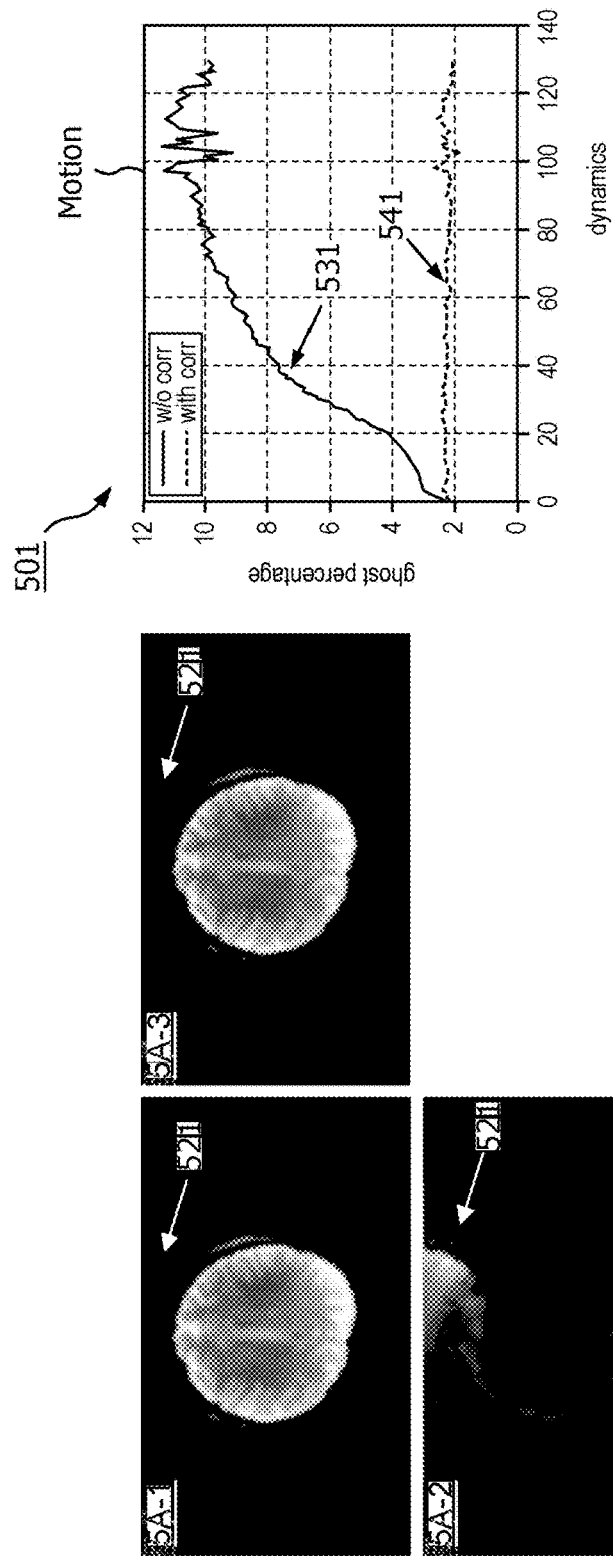
FIG. 5A is a screenshot of images obtained using humans in experiments performed in accordance with embodiments of the present system.
FIG. 5B is a graph showing comparison of test results of human test subjects performed in accordance with embodiments of the present system.

FIG. 5A shows a screenshot of images obtained using human subjects in experiments performed in accordance with embodiments of the present system. The images are labeled 5A-1, 5A-2, and 5A-3 and show acquisition with initial phase correction only, difference, and patch images, respectively. Arrows 521 illustrate a Nyquist ghost border.

FIG. 5B is a graph 501 showing comparison of test results of human test subjects performed in accordance with embodiments of the present system. More, particularly, graph 501 illustrates percent ghosting (e.g., Nyquist ghosting) vs. scan dynamic for acquisition with initial phase correction only scans 531 (e.g., scans) and patched scans 541 (i.e., navigator corrected scans performed in accordance with embodiments of the present system). In the acquisition with initial phase correction only scans 531, the percent ghosting increases as the scan dynamic increases and includes a fluctuating area towards the end of the scan due to motion of a test subject such as a human test subject. However, in the patched (e.g., navigator corrected) scans 541, the percent ghosting remains substantially stable during the course of the scan (e.g., as the scan dynamic increases) and may actually decrease (c.f., $20^{th}$ and $90^{th}$ scan dynamic). Further, instability of the acquisition with initial phase correction only scan 531 due to the motion is well attenuated in the patched scans 541.

Thus, embodiments of the present system may correct imaging data with delay (e.g., navigator) data obtained at the same echo time(s) as phase-encoded slice-specific data. Accordingly, a navigator method of the present system may be used to correct raw image information (e.g., in delay and frequency offset) to reduce and/or stabilize Nyquist ghost levels and provide improved image quality as compared with conventional fMRI systems and methods.

Figure 6:
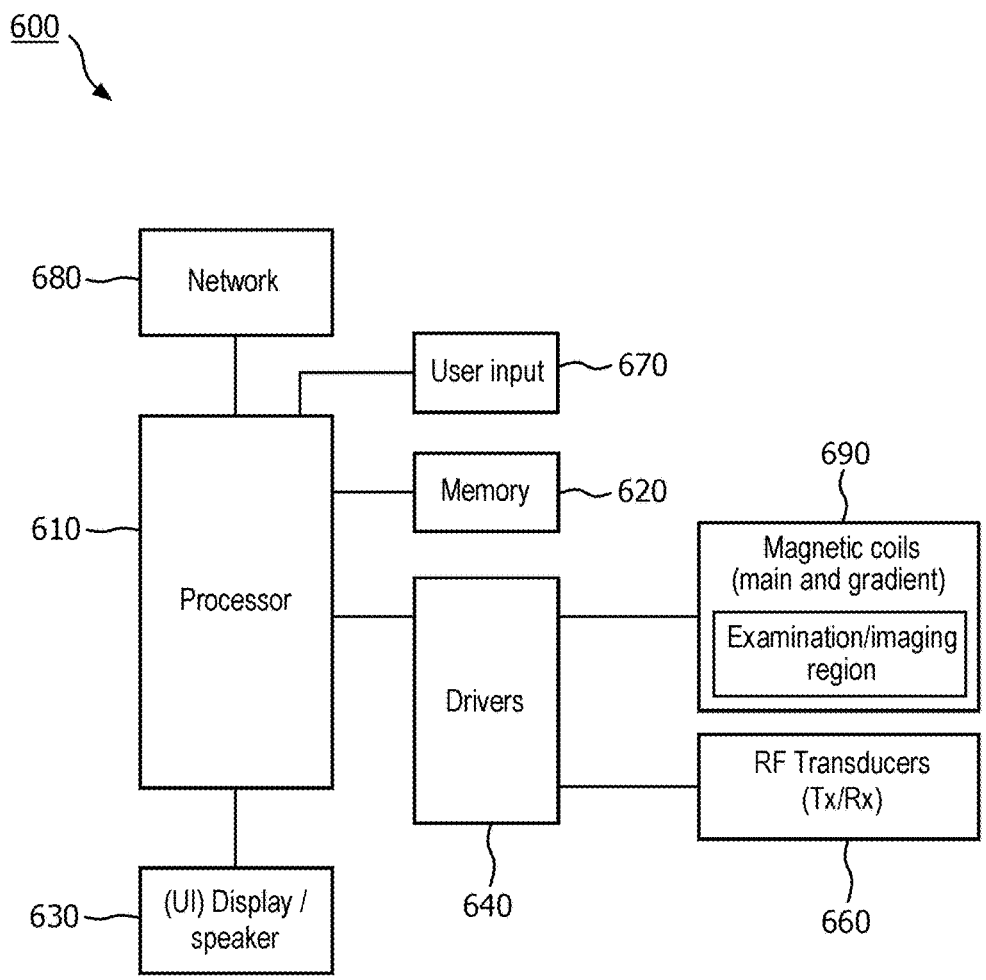
FIG. 6 is a portion of a system in accordance with embodiments of the present system.

FIG. 6 shows a portion of a system 600 in accordance with embodiments of the present system. For example, a portion of the present system 600 may include a processor 610 (e.g., a controller) operationally coupled to a memory 620, a user interface 630, drivers 640, RF transducers 660, magnetic coils 690, and a user input device 670. The memory 620 may be any type of device for storing application information as well as other information related to the described operation. The application information and other information are received by the processor 610 for configuring (e.g., programming) the processor 610 to perform operation acts in accordance with the present system. The processor 610 so configured becomes a special purpose machine particularly suited for performing in accordance with embodiments of the present system.

The magnetic coils 690 may include main magnet coils (e.g., main magnets, DC coils, etc.), and the gradient coils (e.g., x-, y-, and z-gradient coils, gradient slice select, gradient phase encoding, etc.) and may be controlled to emit a main magnetic field and/or gradient fields in a desired direction and/or strength in accordance with embodiments of the present system.

The operation acts may include configuring an MRI system 600 by, for example, the processor 620 controlling the drivers 640 to generate main, gradient, and/or RF signals for output by the main magnet coils, gradient coils, and/or RF transducers, respectively. Thereafter, echo information may be received by receivers of the RF transducers 660 and provided to the processor 610 for further processing and/or reconstruction into image information in accordance with embodiments of the present system. This information may include navigator information. The processor 610 may control the drivers 640 to provide power to the magnetic coils 690 so that a desired magnetic field is emitted at a desired time. The RF transducers 660 may be controlled to transmit RF pulses at the test subject and/or to receive information such as MRI (echo) information therefrom. A reconstructor may process detected information such as echo information and transform the detected echo information into content in accordance with methods of embodiments of the present system. This content may include image information (e.g., still or video images, video information, etc.), information, and/or graphs that may be rendered on, for example, the user interface (UI) 630 such as a display, a speaker, etc. Further, the content may then be stored in a memory of the system such as the memory 620 for later use and/or processing in accordance with embodiments of the present system. Thus, operation acts may include requesting, providing, and/or rendering of content such as, for example, reconstructed image information may be obtained from the echo information and be navigator corrected in accordance with embodiments of the present system. The processor 610 may render the information on the UI 630 such as on a display of the system. The reconstructor may obtain image information (e.g., raw, etc.), navigator information, prep-phase information, etc., and may reconstruct the image information in accordance with the navigator information and/prep phase information using any suitable image processing method or methods (e.g., digital signal processing (DSP), algorithms, echo-planar imaging methods, etc., so as to enable rendering of the image information. For example, the reconstructor may calculate and correct gradient delays in reconstruction in real time.

The user input 670 may include a keyboard, a mouse, a trackball, or other device, such as a touch-sensitive display, which may be stand alone or be a part of a system, such as part of a personal computer, a personal digital assistant (PDA), a mobile phone, a monitor, a smart- or dumb-terminal or other device for communicating with the processor 610 via any operable link. The user input device 670 may be operable for interacting with the processor 610 including enabling interaction within a UI as described herein. Clearly the processor 610, the memory 620, display 630, and/or user input device 670 may all or partly be a portion of a computer system or other device such as a client and/or server.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, such as the memory 620 or other memory coupled to the processor 610.

The processor 610 is operable for providing control signals and/or performing operations in response to input signals from the user input device 670 as well as in response to other devices of a network and executing instructions stored in the memory 620. For example, the processors 610 may obtain feedback information from the sensors 640, may determine whether there is a mechanical resonance. The processor 610 may include one or more of a microprocessor, an application-specific or general-use integrated circuit(s), a logic device, etc. Further, the processor 610 may be a dedicated processor for performing in accordance with the present system or may be a general-purpose processor wherein only one of many functions operates for performing in accordance with the present system. The processor 610 may operate utilizing a program portion, multiple program segments, or may be a hardware device utilizing a dedicated or multi-purpose integrated circuit.

Embodiments of the present system may have provided stable and reproducible fMRI image information and may be compatible with use in conventional MRI systems such as PHILIPS™ Achieva™ and Ingenia™ imaging systems and the like.

Embodiments of the present system stabilize and/or reduce a ghost level in fMRI dynamic scans. As described above and in accordance with embodiments of the present system, a navigator signal immediately preceding each dynamic scan is performed to track the gradient delays in real time and calculation and correction of the gradient delays in the reconstruction may be performed in real time.

Further variations of the present system would readily occur to a person of ordinary skill in the art and are encompassed by the following claims. Through operation of the present system, a virtual environment solicitation is provided to a user to enable simple immersion into a virtual environment and its objects.

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) no specific sequence of acts or steps is intended to be required unless specifically indicated; and i) the term "plurality of" an element includes two or more of the claimed element, and does not imply any particular range of number of elements; that is, a plurality of elements may be as few as two elements, and may include an immeasurable number of elements.

What is claimed is:

1. A magnetic resonance imaging system, the magnetic resonance imaging system comprising at least one controller configured to:

perform a preparation scan to acquire preparation echo phase information for a plurality of dynamics of a scan;

output a plurality of pulse sequences each of which comprises a navigator sequence and an image sequence wherein the navigator and image sequences of a particular one of the plurality of pulse sequences is configured for a corresponding dynamic of the plurality of dynamics of the scan;

acquire navigation and image information for each corresponding pulse sequence of the plurality of pulse sequences; and form corrected image information by correcting echo phase information of the image information in accordance with the preparation echo phase information and correcting at least one of gradient delay or frequency offset of the image information in accordance with the navigation information.

2. The magnetic resonance imaging system of claim 1, wherein in each of the plurality of pulse sequences, the navigator sequence immediately precedes the image sequence.

3. The magnetic resonance imaging system of claim 1, wherein the navigator sequence comprises one or more:

a radio frequency signal having a reduced flip angle waveform as compared to a corresponding image sequence; or a slice select gradient signal having a reduced slice selection waveform as compared to the corresponding image sequence.

4. The magnetic resonance imaging system of claim 1, wherein the controller is configured to switch off phase encoding gradients when performing the navigator sequence.

5. The magnetic resonance imaging system of claim 1, wherein the image sequence comprises a series of phase encoding gradient pulses.

6. The magnetic resonance imaging system of claim 1, wherein the controller is configured to reconstruct at least one image in accordance with the corrected image information.

7. The magnetic resonance imaging system of claim 6, further comprising:

a display configured to render the reconstructed at least one image.

8. A method of generating magnetic resonance image information of a volume with a magnetic resonance imaging system, the method comprising:

with a magnetic resonance scanner, performing a preparation scan to acquire preparation echo phase information for a plurality of dynamics of a scan;

with the magnetic resonance scanner, generating a plurality of pulse sequences each of which comprises a navigator sequence and an image sequence wherein the navigator and image sequences of a particular one of the plurality of pulse sequences is configured for a corresponding dynamic of the plurality of dynamics of the scan;

with the magnetic resonance scanner, acquiring navigation and image information for each corresponding pulse sequence of the plurality of pulse sequences; and with at least one processor, forming corrected image information by correcting echo phase information of the image information in accordance with the preparation echo phase information, and correcting at least one of a gradient delay or a frequency offset of the image information in accordance with the navigation information.

9. The method of claim 8, further comprising an act of generating the navigator sequence immediately preceding the image sequence in each of the plurality of pulse sequences.

10. The method of claim 8, wherein the navigator sequence comprises at least one of:
   a radio frequency signal having a reduced flip angle waveform as compared to a corresponding image sequence; or
   a slice select gradient signal having a reduced slice selection waveform as compared to the corresponding image sequence.

11. The method of claim 8, wherein generating the navigator sequence further comprises:
   switching off phase encoding gradients.

12. The method of claim 8, further comprising:
   generating the image sequence with at least a series of phase encoding gradient pulses.

13. The method of claim 8, further comprising: reconstructing at least one image from the corrected image information.

14. The method of claim 13, further comprising: rendering the reconstructed at least one image on a display.

15. A non-transitory computer readable memory medium carrying a computer program configured to control main coils, gradient coils, and radio frequency transducers of a magnetic resonance imaging system to perform the method of claim 8.

16. A magnetic resonance imaging system comprising:
   a main magnet configured to generate a main magnetic field in an imaging region;
   gradient magnetic field coils configured to generate gradient magnetic fields in the imaging region;
   one or more RF coils configured to transmit radio frequency signals into an examination region and receive magnetic resonance signals emanating from the examination region;
   a display device; and
   at least one processor configured to:
      control the gradient magnetic field coils and the radio frequency coils to:
         perform a preparation scan to acquire preparation echo phase information,
         generate a plurality of pulse sequences, each pulse sequence including corresponding navigator and image subsequences,
         acquire corresponding navigation information and image information for each pulse sequence of the plurality of pulse sequences;
      correct the acquired navigation information and the acquired image information with the preparation echo pulse information to generate a corresponding preparation echo pulse information corrected pulse sequence,
      correct the echo phase information corrected image information for each pulse sequence using the corresponding preparation echo phase corrected navigation information of the same sequence to correct for a gradient delay or a frequency offset of the image information to generate navigator corrected image information;
      reconstruct the navigator corrected image information into one or more images; and
      control the display to render the reconstructed one or more images.

17. The magnetic resonance imaging system of claim 16, wherein in each pulse sequence, the navigator subsequence immediately precedes the image subsequence.

18. The magnetic resonance imaging system of claim 16, wherein the navigator sequence includes:
   a radio frequency signal having a reduce flip angle waveform as compared to the corresponding image subsequence; and
   a slice select gradient signal having a reduced slice select waveform as compared to the corresponding image subsequence.

19. The magnetic resonance imaging system of claim 16, wherein the one or more processors is further configured to switch off phase encoding gradients during the navigator subsequence.

20. The magnetic resonance imaging system of claim 19, wherein the image subsequences include a plurality of phase encoding gradient pulses.

* * * * *